United States Patent [19]

Rodden

[11] Patent Number: 4,864,285

[45] Date of Patent: Sep. 5, 1989

[54] METHOD AND APPARATUS FOR TESTING CONTACTS TO DETERMINE IF OPENED OR CLOSED

[75] Inventor: Steve Rodden, Muskogee, Okla.

[73] Assignee: O G & E, Oklahoma City, Okla.

[21] Appl. No.: 193,264

[22] Filed: May 11, 1988

[51] Int. Cl.$^4$ .................... G08B 21/00; G01R 31/02
[52] U.S. Cl. ............................ 340/644; 324/415; 324/538
[58] Field of Search ............... 324/415, 538, 543, 96, 324/66; 340/644

[56] References Cited

U.S. PATENT DOCUMENTS

| | | |
|---|---|---|
| 3,559,051 | 1/1971 | Mazurek . |
| 3,626,248 | 12/1971 | Barthlet . |
| 3,746,880 | 7/1973 | Iritani et al. . |
| 4,272,725 | 6/1981 | Weiner et al. . |
| 4,322,769 | 3/1982 | Cooper . |
| 4,340,842 | 7/1982 | Togneri . |
| 4,389,694 | 6/1983 | Cornwell, Jr. . |
| 4,398,144 | 8/1983 | Heidemann . |
| 4,672,310 | 6/1987 | Sayed ............................ 324/133 |
| 4,691,143 | 9/1987 | Lange . |

Primary Examiner—Reinhard J. Eisenzopf
Assistant Examiner—Anthony L. Miele
Attorney, Agent, or Firm—Dunlap, Codding, Peterson & Lee

[57] ABSTRACT

A system for testing the conditions of at least one pair of contacts to determine if the contacts are opened or closed comprising a transmit circuit and a receive circuit. The transmit circuit generates and outputs a test signal having a known frequency and the test signal is optically coupled to the contacts. The receiving circuit receives the test signal from the contacts and outputs one output indication indicating the contacts are closed in response to receiving the test signal and outputs one other indication indicating the contacts are opened in resposne to not receiving the test signal. The receiving circuit also optically couples the test signal from the contacts to the indicating means.

8 Claims, 3 Drawing Sheets

METHOD AND APPARATUS FOR TESTING CONTACTS TO DETERMINE IF OPENED OR CLOSED

FIELD OF THE INVENTION

The present invention generally relates to systems for testing contacts to determine if the contacts are opened or closed and, more particularly, but not by way of limitation, to systems for testing contacts to determine if the contacts are opened or closed by optically coupling a test signal having a known frequency to the contacts and by optically coupling the test signal from the contacts to indicating means for outputting indications indicating if the contacts are opened or closed.

BRIEF DESCRIPTION OF THE PREFERRED EMBODIMENTS

Figure 1:
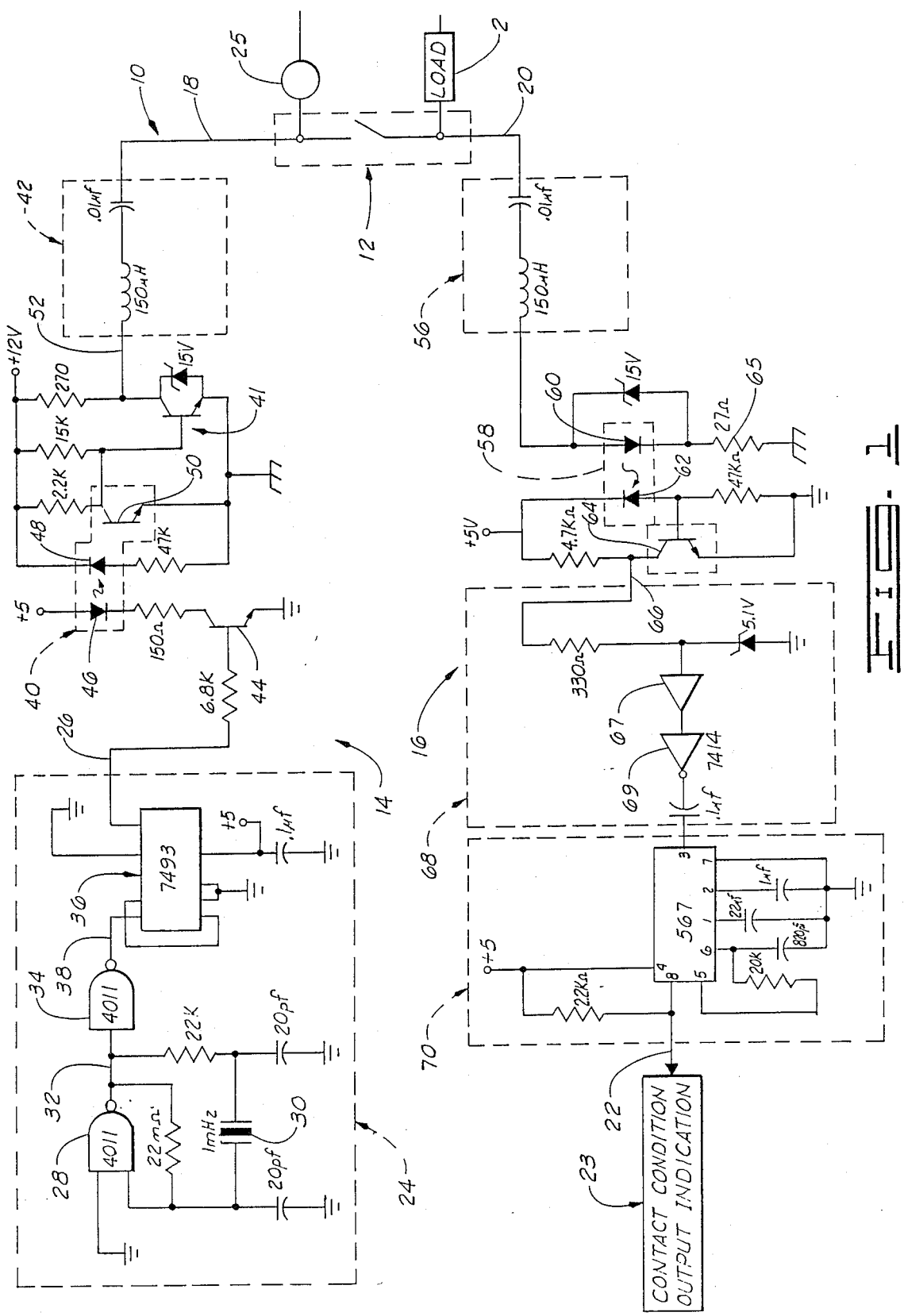
FIG. 1 is a schematic view of a system constructed in accordance with the present invention for testing at least one pair of contacts to determine if the contacts are open or closed.

Referring to the drawings shown therein and designated by the general reference numeral 10 is a system for testing at least one pair of contacts to determine if the contacts are opened or closed, a pair of contacts being shown diagrammatically in FIG. 1 and designated therein by the general reference numeral 12. The system 10 includes a transmit circuit 14 and a receiving circuit 16. The transmit circuit 14 is connected to one of the contacts 12 and the transmit circuit 14 is adapted to output a test signal on a signal path 18. The receiving circuit 16 is connected to one of the contacts 12 by way of a signal path 20 and the receiving circuit 16 is adapted to receive the test signal in the closed condition of the contacts 12.

In operation, the transmit circuit 14 outputs the test signal on the signal path 18. If the contacts are opened, as shown in FIG. 1, the test signal will not be transmitted through the contacts 12 and the test signal will not be inputted into the receiving circuit 16. In response to not receiving the test signal, the receiving circuit 16 is adapted to output one output indication indicating that the contacts are opened. In the closed condition of the contacts 12, the test signal will be inputted into the receiving circuit 16 through the contacts 12 and the signal path 20. The receiving circuit 16 is adapted to output one other output indication on a signal path 22 indicating that the contacts are closed in response to receiving the test signal over the signal path 20.

The contacts 12 are illustrated in FIG. 1 as being part of an electrical circuit comprising an electrical generating means 25 and a load 27. Utilizing the present invention, the electrical generating means 25 can be either DC or AC. The output indications from the receiving circuit 16 outputted on the signal path 22 may be connected to a light indicating device for providing a visually perceivable output indication indicating whether the contacts are opened or closed. In the alternative, the output signal from the receiving circuit 16 provided on the signal path 22 may be connected to an alarm for providing an audibly perceivable output indication indicating whether the contacts 12 are opened or closed. In one further alternative, the output signals from the receiving circuit 16 outputted on the signal path 22 may be connected to a recorder for providing a visually perceivable output indication indicating whether the contacts 12 are opened or closed. In yet another alternative, the output indications from the receiving circuit 16 provided on the signal path 22 may be connected to some other circuit for stopping equipment or starting equipment in response to such received output indications from the receiving circuit 16. All of these alternatives are encompassed by a contact condition output indicator 23 shown in FIG. 1 for providing the output indication indicating the condition of the contacts, opened or closed, sometimes referred to herein as indicating means.

The receiving circuit 16 includes an oscillator 24 which is constructed and adapted to output the test signal having a known frequency on an output signal path 26. In one embodiment, the oscillator 24 was adapted to output a test signal having a frequency of 125 KHz.

The oscillator 24 consists of a NAND gate 28 connected in a feedback loop with a crystal 30 outputting a signal having a known frequency, 1 MHz in one example, on a signal path 32. The 1 MHz signal on the signal path 32 is buffered through a NAND gate 34 and connected to the clock input of a counter 36 by way of a signal path 38. In one embodiment, the counter 36 is a divide by four counter and the counter 36 is adapted to output the test signal on the signal path 26 having a frequency of 125 KHz. In this embodiment, the crystal 30 is a 1 MHz crystal. The test signal outputted by the oscillator 24 is inputted into an optical coupler 40. The optical coupler 40 operates to optically couple the test signal from the oscillator 24 through a resonant circuit 42 to one of the contacts 12 by way of the signal path 18.

The optical coupler 40 consists of a transistor 44 connected to first light emitting diode 46. The light emitting diode 46 is positioned near a diode 48 so that light emitted from the light emitting diode 46 causes the diode 48 to conduct in response thereto.

The transistor 44 amplifies the test signal received from the oscillator 24. The amplifying of the test signal by the transistor 44 drives the first LED 46 thereby causing the light emitting diode 46 to emit light in response to the test signal. The light emitted by the light emitting diode 46 drives the diode 48 thereby causing the test signal to be generated or outputted by the diode 48. The test signal generated by the diode 48 is amplified by a transistor 50 and outputted on a signal path 52 from the optical coupler 40. The test signal outputted on the signal path 52 from the optical coupler 40 is passed through the resonant circuit 42 and outputted on the transmit circuit 14 output signal path 18.

The optical coupler 40 in conjunction with the resonant circuit 42 functions to keep the intense EMI and transient voltage created by the circuit under test (the circuit connected to the contacts 12) optically isolated from the oscillator 24. The resonant circuit 42 is tuned precisely to the test frequency to pass the test frequency with little opposition and greatly oppose the source 25, EMI and transient voltages.

In one embodiment, the following commercially available components may be utilized to construct the transmit circuit 14.

| Component | Manufacturer | Model No. |
| --- | --- | --- |
| 1. Crystal 30 | — | —, MHz crystal |
| 2. Counter 36 | National Semiconductor | 7493, binary divide by 4 counter |
| 3. Optical coupler 40 consisting of the diodes 46 and 48 together with a transistor 54 sold as a unit | Hewelet Packard | 6N136, high speed optical coupler |
| 4. NAND gates 28 and 34 | Texas Instruments | 4011 |

The receiving circuit 16 is connected to one of the contacts 12 by way of the signal path 20 so that, in the closed position of the contacts 12, the test signal is passed to the receiving circuit 16 through the contacts 12. The test signal is passed through a filter 56 and inputted into an optical insulator 58.

The optical coupler 58 includes a light emitting diode 60 which is optically coupled to a emitting diode 62. The test signal on the signal path 20 causes the light emitting diode 60 to emit light in response to the received test signal. The light emitted from the light emitting diode 60 is received by the diode 62 causing the diode 62 to conduct current. The diode 62 is connected to a transistor 64 and the transistor 64 amplifies and outputs the test signal on a signal path 66. The optical isolator 58 thus optically couples the test signal from the contacts 12 to the receiving circuit 16. The optical coupler 58 in conjunction with the filter 56. The filter 56 is tuned precisely to the test frequency to pass the test frequency with little opposition and greatly oppose the source 25, EMI and transient voltages and functions to isolate the receiving circuit 60 substantially to keep the EMI and transient voltage isolated from the components of the receiving circuit downstream from the optical coupler 58.

A resistor 65 is connected to the optical coupler 58. The resistor 65 can be a fixed resistance or a variable resistance.

When the contacts 12 are closed, the contacts 12 ideally have a zero resistance. As the contacts 12 are opened and closed in operation, the resistance typically increases. By setting the resistance value of the resistor 65, the amount of current flowing through the light emitting diode 60 is determined. Thus, even though the contacts 12 are closed, the test signal will not be coupled through the optical coupler 58 if the resistance value of the contacts 12 exceeds a predetermined value as set by the resistor 65. The resistor 65 thus provides means for determining the resistance value of the contacts 12 exceeds a predetermined resistance value.

The test signal on the signal path 66 is passed through a signal conditioning network 68 and is inputted into a phase lock loop network 70 which is tuned for the frequency of the test signal, 125 KHz in the example illustrated in FIG. 1 and referred to before. The signal conditioning network 68 consists of a TTL level converter 67 and an inverter 69.

The phase lock loop network 70 is constructed to output a HIGH signal on the signal path 22 in response not receiving the test signal thereby indicating that the contacts 12 are opened. The phase lock loop network 70 is adapted to output a low signal in response to receiving the test signal on the signal path 66 thereby indicating the contacts 12 are closed. The signal outputted by the phase lock loop network 70 is inputted into and received by the contact condition output indicator 23.

The system 10 can be permanently connected to contacts to be tested or the system 10 can be incorporated into a hand held unit which would allow maintenance personnel to test contacts without downing critical circuitry. In addition, the system 10 could be incorporated into a critical relay monitoring system for monitoring the operation of a relay so that if the relay coil was energized and the contacts did not close, the contact condition output indicator 23 would provide an output indication such as an alarm for example.

The basic components of the receiving circuit 16 are commercially available as follows:

| Component | Manufacturer | Model No. |
| --- | --- | --- |
| 1. Optical Coupler 58 including the diodes LED 60 and 62 and the transistor 64 | Hewelet Packard | 6N136, high speed optical coupler |
| 2. Phase Lock Loop | Texas Instruments | 567 |
| 3. Inverter 69 | Texas Instruments | 7414 |
| 4. TTL level Converter 67 | Texas Instruments | 4050 |

When the contacts 12 are closed, the switch actually bounces on the contacts 12 thereby causing the contacts 12 to be opened and closed many times during a very short time period. This causes high voltage noise to induce in the circuit. The optical coupler 40 functions to isolate this noise from the oscillator 24 and the optical coupler 58 functions to isolate this noise from the components downstream from the optical isolator 58.

Figure 2:
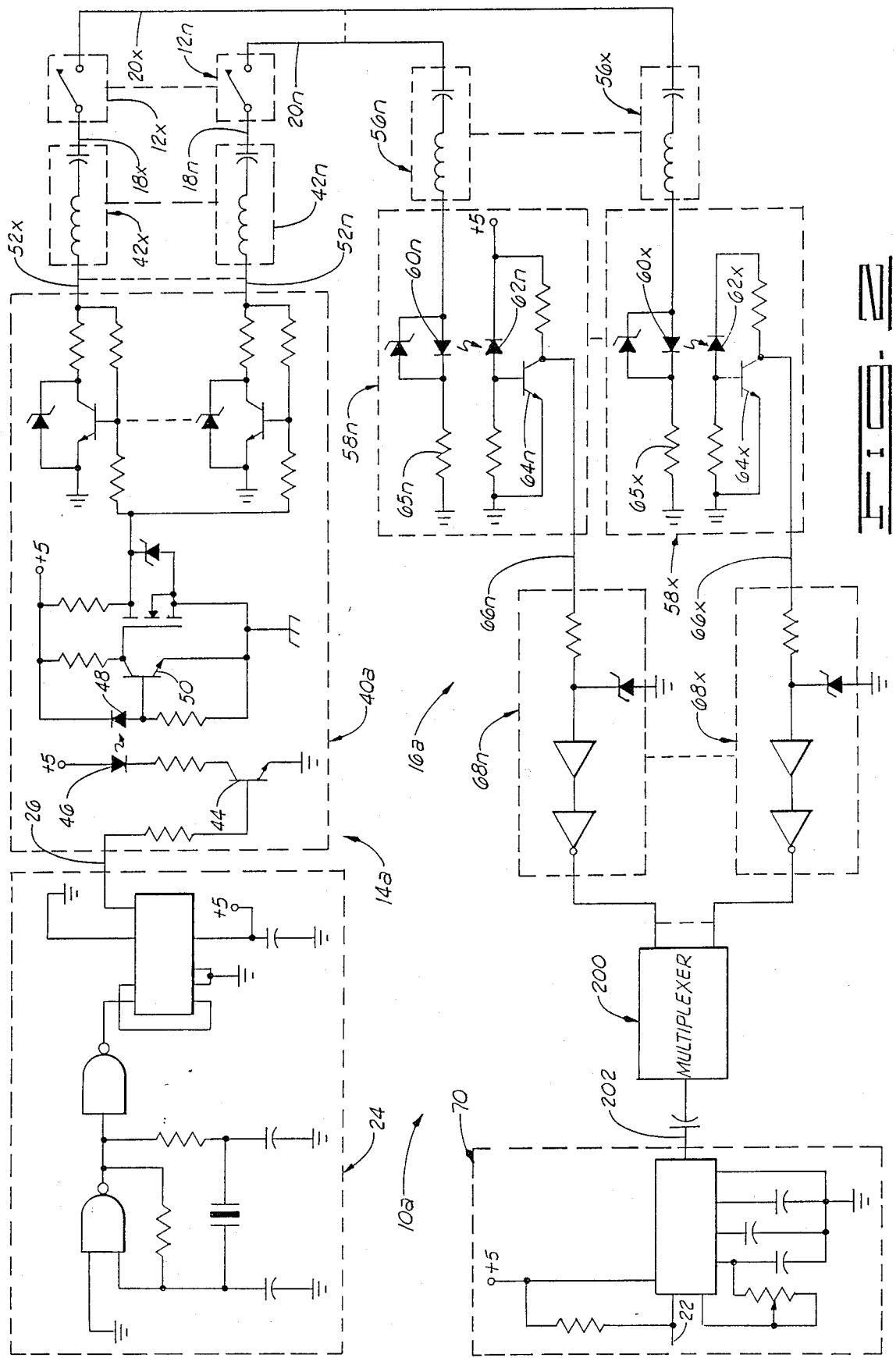
FIG. 2 is a schematic view of a system constructed in accordance with the present invention for testing a plurality of contacts to determine if the contacts are opened or closed.
Figure 3:
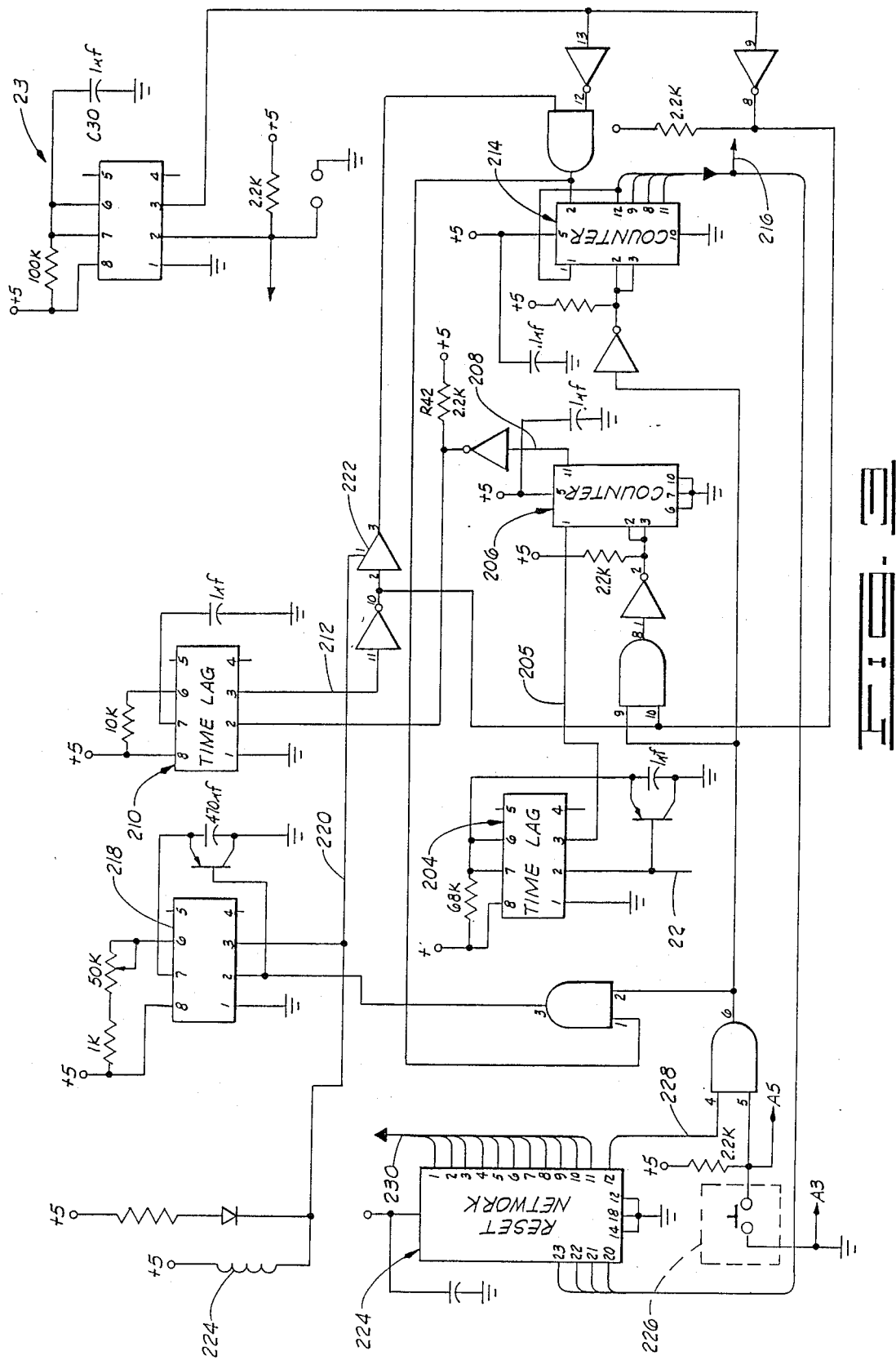
FIG. 3 is a schematic view of a contact condition output indicator for use with the system shown in FIG. 2.

Embodiments of FIG. 2 and 3

Shown in FIG. 2 is a modified system 10a which particularly is adapted to monitor a plurality of contacts to determine the opened or closed condition of such contacts. The plurality of contacts are diagrammatically illustrated in FIG. 2 and designated therein by the reference numerals 12x through 12n. The transmit circuit 14a includes the oscillator 24 which is constructed exactly like the oscillator 24 described before and functions to output the test signal over a signal path 26. The test signal outputted by the oscillator 24 on the signal path 26 is inputted into an optical coupler 40a. The optical coupler 40a is constructed exactly like the optical coupler 40 described in detail before except the optical isolator 40a is adapted to output the test signal over a plurality of signal paths, two such signal paths being shown in FIG. 2 and designated therein by the reference numerals 52x and 52n. The test signals outputted by the optical coupler 40a over the signal paths 52x through 52n are inputted into and passed through a plurality of filters, two filters being shown in FIG. 2 and designated therein by the reference numerals 42x and 42n.

The test signal is outputted from the filter 42x 12x. The test signal is outputted by the filter 42n over the signal path 18n and passed through the contacts 12n.

In the closed condition of the contacts 12x, the test signal is passed over the signal path 20x to the receiving circuit 16a. In the closed condition of the contacts 12n, the test signal is passed over the signal path 20n to the receiving circuit 16a.

The test signal on the signal path 20n is passed through a filter 56n. The test signal on the signal path 20x is passed through a filter 56x.

The receiving circuit 16a includes a plurality of optical couplers 58, two couplers being shown in FIG. 2 and designated therein by the reference numerals 58n and 58x. The optical couplers 58n through 58x are constructed exactly like the optical coupler 58 described in detail before.

The test signal is optical coupled through the coupler 58n and outputted over the signal path 66n and passed through the signal conditioning network 68n. The test signal is optically coupled through the optical coupler 58x and outputted over the signal path 66x and passed through the signal conditioning network 68x. The signal conditioning networks 68n through 68x are constructed exactly like the signal conditioning networks 68 described in detail before.

The signals outputted by the signal conditioning networks 68n through 68x each are inputted into a multiplexer 200. The multiplexer 200 is adapted to output sequentially the test signals received from each of the signal conditioning networks 68n through 68x over a signal path 202 and to input each such test signal through the phase lock loop network 70. The phase lock loop network 70 is constructed and operates exactly like the phase lock loop network 70 described in detail before. The phase lock loop network 70 outputs a signal in a low state in response to receiving the test signal over the signal path 202 thereby indicating the contacts 12 are closed. The phase lock loop network 70 also functions to output a signal on the signal path 22 in the HIGH state in response to not receiving the test signal thereby indicating the contacts 12 are opened.

The system 10a as just described, functions to monitor a plurality of contacts in a manner exactly like that described before with respect to the system 10. The system 10a functions to monitor the plurality of contacts 12 using a single oscillator 24 and a single optical coupler 40a with a plurality of outputs. The demultiplexer 200 functions to permit the sequential outputs indicating the state, opened or closed, of each of the monitored contacts 12.

Shown in FIG. 3 is one particular embodiment of a contact condition output indicator 23 for receiving the outputs on the signal path 22 and providing the output indication for indicating the state or condition, opened or closed, of the monitored contacts.

In this embodiment, the signal outputted by the phase lock loop network 70 on the signal path 22 is inputted into a time lag network 22 which is adapted to length the duration of the pulse outputted by the phase lock loop network 70 and to output the pulse on a signal path 205. The time lag network 204 functions as a signal conditioning network to accommodate for the bouncing of the switch closing the monitored contacts 12 and to smooth out the signal outputted by the phase lock loop network 70. The signal outputted by the time lag network 204 is inputted into a divide by five counter 206. The divide by five counter 206 is adapted to provide an output on a signal path 208 in response to receiving five input pulses indicating that the contacts 12 being monitored have been closed five times.

The counter 206 output on the signal path 208 is inputted into another time lag network 210. The time lag network 210 provides an output on a signal path 212 which is inputted into a counter 214. The counter 214 outputs signal on signal paths 216 which are inputted into the multiplexer 200 for conditioning the multiplexer 200 to input the signal received from the selected contacts 12.

A counter 218 outputs a signal on a signal path 220 which is connected to a tri-state buffer 222 for reconditioning the counter 214 if a certain number of pulses are not received within a preset time period. The counter 218 output on the signal path 222 also is connected to a relay coil 224 which is adapted to close a relay for providing an output indication indicating the state of the monitored contacts, opened or closed. For example, the coil 224 may be connected to a relay for activating light emitting diodes on an annunciator panel to indicate the condition of the contacts, opened or closed.

The contact condition outputted indicator 23 shown in FIG. 3 includes a reset network 224 which is connected to a reset switch 226. The reset network 224 provides an output on a signal path 228 for resetting the various components in the contact condition output indicator 23. The reset network 224 also provides output on a plurality of signal paths 230 for resetting the output indicators, such as light emitting diodes, on an annunciator panel.

The various components of contact condition output indicator 23 shown in FIG. 3 are commercially available and some of the more significant components are listed below.

| Component | | Manufacturer | Model No. |
| --- | --- | --- | --- |
| 1. | Time Lag Network 204 | Texas Instrument | 555 |
| 2. | Counter 206 | Texas Instrument | 7490 |
| 3. | Time Lag Network 210 | Texas Instrument | 555 |
| 4. | Counter 214 | Texas Instrument | 7493 |
| 5. | Counter 218 | Texas Instrument | 555 |
| 6. | Reset Network 224 | Texas Instrument | 74154 |

Changes may be made in the construction and operation of the various components and assemblies described herein and changes may be made in the steps or sequence of steps or the methods described herein without departing from the spirit and the scope of the invention as defined in the following claims.

I claim:
1. An apparatus for testing at least one pair of contacts to determine if the contacts are opened or closed, comprising:
   a transmit circuit, comprising:
      means for generating and outputting a test signal having a known frequency; and
      means receiving the test signal and optically coupling the test signal to the contacts, comprising:
   a resonant circuit tuned to the frequency of the test signals; and
   a receiving circuit comprising:
      indicating means for receiving the test signal from the contacts and outputting one output indication indicating the contacts are closed in response to receiving the test signal and outputting one other indication indicating the contacts are opened in response to not receiving the test signal; and means connected to the contacts for optically coupling the test signal from the contacts to the indicating means.

2. The apparatus of claim 1 wherein in the receiving circuit the means for optically coupling the test signal from the contacts to the indicating means is defined further to include:

a first light emitting diode connected to the contacts for receiving the test signal in the closed condition of the contacts and the first light emitting diode emitting light in response to receiving the test signals; and a diode for receiving light emitted from the first light emitting diode and outputting an electrical signal responsive to the light emitted from the first light emitting diode, the diode outputting the test signal in response to the first light emitting diode receiving the test 3. The apparatus of claim 2 wherein, in the transmit circuit, the means receiving the test signal and optically coupling the test signal to the contacts is defined further to include:

a second light emitting diode connected to the contacts for receiving the test signal and emitting light in response to receiving the test signal; and a diode for receiving light from the second light emitting diode and outputting an electrical signal responsive to the light emitted from the second light emitting diode, the diode outputting the test signal in response to the second light emitting diode receiving the test signal, the test signal outputted by the diode being connected to the contacts.

4. The apparatus of claim 1 defined further to include in the receiving circuit means for preventing the test signal from being coupled to the indicating means when the resistance value of the contacts exceeds a predetermined resistance value.

5. The apparatus of claim 1 wherein the receiving circuit is defined further to include:

a filter tuned to the frequency of the test signal.

6. A method for testing at least one pair of contacts to determine if the contacts are opened or closed, comprising the steps of:

generating and outputting a test signal having a known frequency;

optically coupling the test signal to the contacts;

passing the test signal through a resonant circuit tuned to the frequency of the test signal before passing the test signal to the contacts;

optically coupling the test signal from the contacts in the closed position of the contacts to indicating means when the contacts are closed;

outputting one indication from the indicating means indicating the contacts are closed in response to receiving the test signal through the contacts and outputting one other indication indicating the contacts are opened in response to not receiving the test signal through the contacts.

7. The method of claim 6 defined further to include the step of:

preventing the test signal from being coupled to the indicating means when the resistance value of the contacts exceeds a predetermined resistance value.

8. The method of claim 6 defined further to include the step of:

passing the test signal through a filter tuned to the frequency of the test signal before optically coupling the test signal form the contacts.

* * * * *

UNITED STATES PATENT AND TRADEMARK OFFICE
CERTIFICATE OF CORRECTION

PATENT NO. : 4,864,285
DATED : September 5, 1989
INVENTOR(S) : Steve Rodden

It is certified that error appears in the above-identified patent and that said Letters Patent is hereby corrected as shown below:

Column 4, line 66 after the numeral "42x" please insert --over a signal path 18x and passed through the contacts--.

Signed and Sealed this

Twenty-first Day of August, 1990

Attest:

HARRY F. MANBECK, JR.

*Attesting Officer*  *Commissioner of Patents and Trademarks*